United States Patent
Shibano et al.

(10) Patent No.: US 7,095,682 B2
(45) Date of Patent: Aug. 22, 2006

(54) COMPACT OPTICAL SIGNAL DETECTING MECHANISM AND OPTICAL STORAGE DEVICE HAVING IMPROVED SIGNAL QUALITY

(75) Inventors: Motomichi Shibano, Kawasaki (JP); Akihiko Yabuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 714 days.

(21) Appl. No.: 09/822,546

(22) Filed: Mar. 30, 2001

(65) Prior Publication Data
US 2001/0028611 A1 Oct. 11, 2001

(30) Foreign Application Priority Data
Apr. 6, 2000 (JP) ............................. 2000-104756
Jan. 26, 2001 (JP) ............................. 2001-018714

(51) Int. Cl.
*G11B 7/00* (2006.01)
(52) U.S. Cl. .......................... 369/44.14; 369/112.01; 369/53.11
(58) Field of Classification Search ............ 369/44.14, 369/53.11, 112, 112.01; 257/69
See application file for complete search history.

(56) References Cited

U.S. PATENT DOCUMENTS

| | | | | |
|---|---|---|---|---|
| 3,742,464 A | * | 6/1973 | Rajchman et al. | 365/127 |
| 4,672,187 A | * | 6/1987 | Fujita et al. | 250/201.5 |
| 5,327,006 A | * | 7/1994 | Beasom | 257/583 |
| 5,367,530 A | * | 11/1994 | Noishiki et al. | 372/43 |
| 5,566,142 A | * | 10/1996 | Nakano et al. | 369/122 |
| 5,708,644 A | * | 1/1998 | Hasegawa | 369/44.12 |
| 5,790,504 A | | 8/1998 | Hayashi et al. | 369/112 |
| 6,011,768 A | * | 1/2000 | Taguchi | 369/116 |
| 6,134,208 A | * | 10/2000 | Taniguchi et al. | 369/112.19 |
| 6,339,256 B1 | * | 1/2002 | Akram | 257/691 |

FOREIGN PATENT DOCUMENTS

| | | |
|---|---|---|
| JP | 59096789 | 6/1984 |
| JP | 06195742 | 7/1994 |
| JP | 07235066 | 9/1995 |
| JP | 07272304 | 10/1995 |
| JP | 08221788 | 8/1996 |
| JP | 10233028 | 9/1998 |
| JP | 10241192 | 9/1998 |
| JP | 11306574 | 11/1999 |
| JP | 11316967 | 11/1999 |
| JP | 2000021012 | 1/2000 |

\* cited by examiner

Primary Examiner—Gautam R. Patel
(74) Attorney, Agent, or Firm—Greer, Burns & Crain, Ltd.

(57) ABSTRACT

An optical pickup including a stem; a substrate mounted on the stem; a laser diode mounted on, and electrically insulated from, the substrate; and a photodetector provided on the substrate for detecting return light from an object to be irradiated. The substrate is biased at a given voltage and has an insulating member opposed to the stem. The laser diode has a first electrode opposed to the substrate with a first insulating film, a conductor film, and a second insulating film interposed between the first electrode and the substrate.

8 Claims, 12 Drawing Sheets

FIG. 1
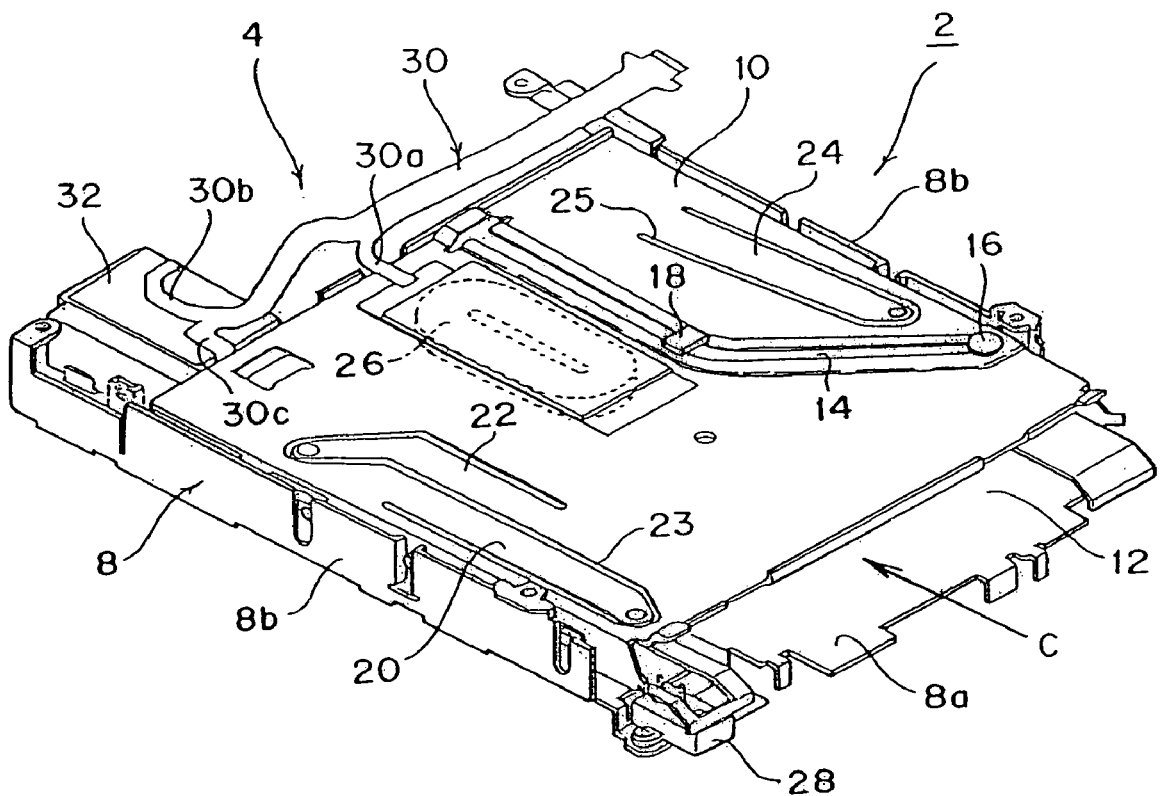
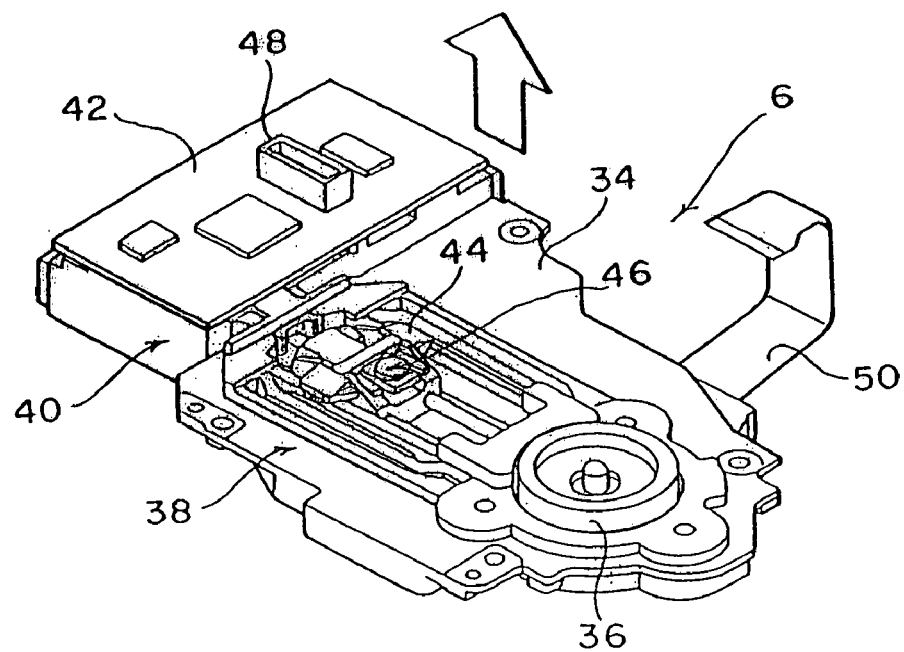

COMPACT OPTICAL SIGNAL DETECTING MECHANISM AND OPTICAL STORAGE DEVICE HAVING IMPROVED SIGNAL QUALITY

BACKGROUND OF THE INVENTION

1. Field of the Invention

The present invention relates to an optical pickup (optical head) for an optical device such as an optical disk drive, optical card drive, optical scanner, and microscope unit.

2. Description of the Related Art

An optical disk inclusive of a magneto-optical disk has received attention as a memory medium that becomes a core in the recent rapid development of multimedia, and it is usually accommodated in a cartridge case to be provided as an optical disk cartridge for practical use. The optical disk cartridge is loaded into an optical disk drive to perform reading/writing of data from/to the optical disk by means of an optical pickup.

The optical pickup in a recent optical disk drive intended to realize size reduction is composed of a fixed optical assembly and a movable optical assembly, wherein the fixed optical assembly includes a laser diode, a beam splitter for reflecting and transmitting a laser beam, and a photodetector for receiving reflected light from an optical disk, whereas the movable optical assembly includes an actuator having a carriage and an objective lens mounted on the carriage. The carriage is movable in the radial direction of the optical disk along a pair of rails by means of a voice coil motor (VCM).

A write-power laser beam output from the laser diode of the fixed optical assembly is first collimated by a collimator lens, next transmitted by the beam splitter, next reflected by a beam raising mirror of the actuator, and finally focused on the optical disk by the objective lens, thereby writing data onto the optical disk. On the other hand, data reading is performed by directing a read-power laser beam onto the optical disk. That is, reflected light from the optical disk is first collimated by the objective lens, next reflected by the beam splitter of the fixed optical assembly, and finally detected by the photodetector, thereby converting the detected optical signal into an electrical signal.

In general, recording media such as an optical disk and a magneto-optical disk are exchanged for use with an optical disk drive. Further, these recording media have warpage or undulation due to strain in forming the media, resulting in the tendency of eccentricity or inclination of the recording media. Accordingly, focusing error detection and tracking error detection must be carried out to read out information recorded on the recording media. A conventional optical pickup for a magneto-optical disk employs many optical components including a plurality of lenses and a plurality of polarization beam splitters, so as to perform the detection of information recorded on the magneto-optical disk and also perform focusing error detection and tracking error detection.

U.S. Pat. No. 5,708,644 discloses an optical pickup using a beam splitter unit having a polarization beam splitter and a beam splitting element to reduce the size of an optical system. In this U.S. patent, a hologram for separating off a focusing error signal and a tracking error signal from a reflected beam is mounted on the lower surface of the beam splitter unit. Further, a laser diode, a first photodiode for detecting a magneto-optical signal, a second photodiode for detecting the focusing error signal, and a third photodiode for detecting the tracking error signal are mounted on a stem.

Thus, the first, second, and third photodiodes are mounted on the stem in the optical pickup described in the above U.S. patent, so that there is a problem of insufficient integration of the photodiodes. To solve this problem, it is considered to provide a silicon (Si) substrate integrally formed with these photodiodes.

In an optical pickup for a magneto-optical disk, a PIN-photodiode is generally used as each photodiode to meet the requirement for a high-speed response signal. Accordingly, in the case of forming a PIN-photodiode integrally with an Si substrate, a reverse bias voltage is applied to the Si substrate to increase a response speed as a photodetecting element. The application of a reverse bias voltage means applying a bias voltage to the cathode of the photodiode.

The stem (optical base) on which the Si substrate is mounted is bonded to a drive base, so that the stem is at the same potential as a ground potential. Therefore, the lower surface of the Si substrate must be insulated from the stem, so as to apply a reverse bias voltage to the Si substrate. Further, the laser diode chip is mounted on the upper surface of the Si substrate, so that an insulating layer must be interposed between the lower surface (electrode surface) of the laser diode chip and the upper surface of the Si substrate. However, in the case that there is a potential difference between the reverse-biased Si substrate and the electrode surface of the laser diode chip, especially in the case that there are high-frequency variations in potential, the potential of the Si substrate is influenced by variations in potential of the electrode of the laser diode.

Such high-frequency variations in potential occur especially in writing data, and have adverse effects on a photodiode for detection of a focusing error signal, a photodiode for detection of a tracking error signal, and a photodiode for monitoring an output from the laser diode, thus causing instability in detecting signals output from these photodiodes.

A region on the Si substrate except the photodiodes (photodetecting regions) also has sensitivity to light, and generates electrical charge when receiving light. This electrical charge has an influence on signal currents generated in the photodiode regions, causing a problem that high-quality signal currents cannot be obtained. This is due to the fact that all of the light quantities of the laser beam output from the laser diode cannot be transmitted or reflected by each optical component, but a part of the laser beam remains in the optical unit to become stray light.

This stray light may enter the photodiode for detection of a magneto-optical signal, the photodiode for detection of a focusing error signal, the photodiode for detection of a tracking error signal, and a photodiode for automatic power control (APC), causing adverse effects on signal currents. As a known technique for shielding such stray light, a metal film is provided on the entire surface of the substrate except the photodiode regions. The metal film is usually formed of aluminum common to the material of wiring on the substrate. However, reflected light from the optical components is further reflected by the metal film to result in an increase in stray light.

SUMMARY OF THE INVENTION

It is therefore an object of the present invention to provide an optical pickup in which an optical signal detecting mechanism is compact and integrated, and the quality of a signal detected by a photodetector is improved.

It is another object of the present invention to provide an optical storage device including an optical pickup in which the quality of a signal detected by a photodetector is improved and low-cost production is allowed.

It is a further object of the present invention to provide an optical pickup and an optical storage device which can solve the problem of stray light incident on the photodiode regions to improve the quality of a regenerative signal and the quality of a servo signal.

In accordance with an aspect of the present invention, there is provided an optical pickup comprising a stem; a substrate mounted on the stem; a laser diode mounted on the substrate; and a photodetector provided on the substrate for detecting return light from an object to be irradiated; the substrate being biased at a given voltage and having an insulating member opposed to the stem.

Preferably, the photodetector comprises a first photodetector for detecting a regenerative signal, a second photodetector for detecting a servo signal from a laser beam focused on the object, and a third photodetector for monitoring an output from the laser diode. The optical pickup further comprises a beam splitter unit having a polarization beam splitter and a beam splitting element formed of a birefringent crystal. The beam splitter unit further has a hologram lens for focusing monitor light to the third photodetector.

Preferably, each of the first and second photodetectors comprises a PIN-photodiode. The laser diode has a first electrode opposed to the substrate with a first insulating film, a conductor film, and a second insulating film being interposed between the first electrode and the substrate. Preferably, the substrate comprises an Si substrate, and each of the insulating member, the first insulating film, and the second insulating film comprises an $SiO_2$ film. Preferably, the conductor film and the stem are connected by a first wire. The laser diode further has a second electrode, and the first and second electrodes of the laser diode are connected to the stem by second and third wires, respectively.

In accordance with another aspect of the present invention, there is provided an optical storage device capable of at least reading information stored in an optical storage medium, comprising a base; a carriage movable along the optical storage medium; a stem mounted on the base; a substrate mounted on the stem; a laser diode mounted on the substrate; an objective lens mounted on the carriage for focusing a laser beam from the laser diode onto the optical storage medium; and a photodetector provided on the substrate for detecting at least a regenerative signal from a reflected beam from the optical storage medium; the substrate being biased at a given potential and having an insulating member opposed to the stem.

In accordance with a further aspect of the present invention, there is provided an optical pickup comprising a stem; a substrate mounted on the stem; a laser diode for outputting a laser beam; a photodetector provided on the substrate for detecting return light from an object to be irradiated with the laser beam; a dummy photodetecting region provided on the substrate adjacent to the photodetector; a dummy electrode formed in the dummy photodetecting region so as to surround the photodetector; and wiring for connecting the dummy electrode to a ground potential.

Preferably, the dummy photodetecting region comprises a first dummy photodetecting region provided on the substrate adjacent to a photodetector for detecting a regenerative signal, and a second dummy photodetecting region provided on the substrate adjacent to a photodetector for detecting a servo signal. The optical pickup further comprises a light shielding film having light absorptivity formed on the substrate so as to cover at least the first and second dummy photodetecting regions. Preferably, the light shielding film comprises a polyimide film.

In accordance with a still further aspect of the present invention, there is provided an optical storage device capable of at least reading information stored in an optical storage medium, comprising a base; a carriage movable along the optical storage medium; a stem mounted on the base; a substrate mounted on the stem; a laser diode for outputting a laser beam; an objective lens mounted on the carriage for focusing the laser beam from the laser diode onto the optical storage medium; a photodetector for detecting at least a regenerative signal from return light from the optical storage medium; a dummy photodetecting region provided on the substrate adjacent to the photodetector; a dummy electrode formed in the dummy photodetecting region so as to surround the photodetector; and wiring for connecting the dummy electrode to a ground potential.

In accordance with a still further aspect of the present invention, there is provided an optical pickup comprising a stem; a substrate mounted on the stem; a laser diode for outputting a laser beam; a photodetector provided on the substrate for detecting return light from an object to be irradiated with the laser beam; and a metal layer provided on the substrate so as to cover at least a region adjacent to the photodetector, the metal layer having a surface modified so as to have light absorptivity.

Preferably, the metal layer comprises an anodized aluminum film.

In accordance with a still further aspect of the present invention, there is provided an optical storage device capable of at least reading information stored in an optical storage medium, comprising a base; a carriage movable along the optical storage medium; a stem mounted on the base; a substrate mounted on the stem; a laser diode for outputting a laser beam; an objective lens mounted on the carriage for focusing the laser beam from the laser diode onto the optical storage medium; a photodetector provided on said substrate for detecting at least a regenerative signal from a reflected beam from the optical storage medium; and a metal layer provided on the substrate so as to cover at least a region adjacent to the photodetector, the metal layer having a surface modified so as to have light absorptivity.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 1 is an exploded perspective view of a magneto-optical disk drive;

DETAILED DESCRIPTION OF THE PREFERRED EMBODIMENTS

Figure 2:
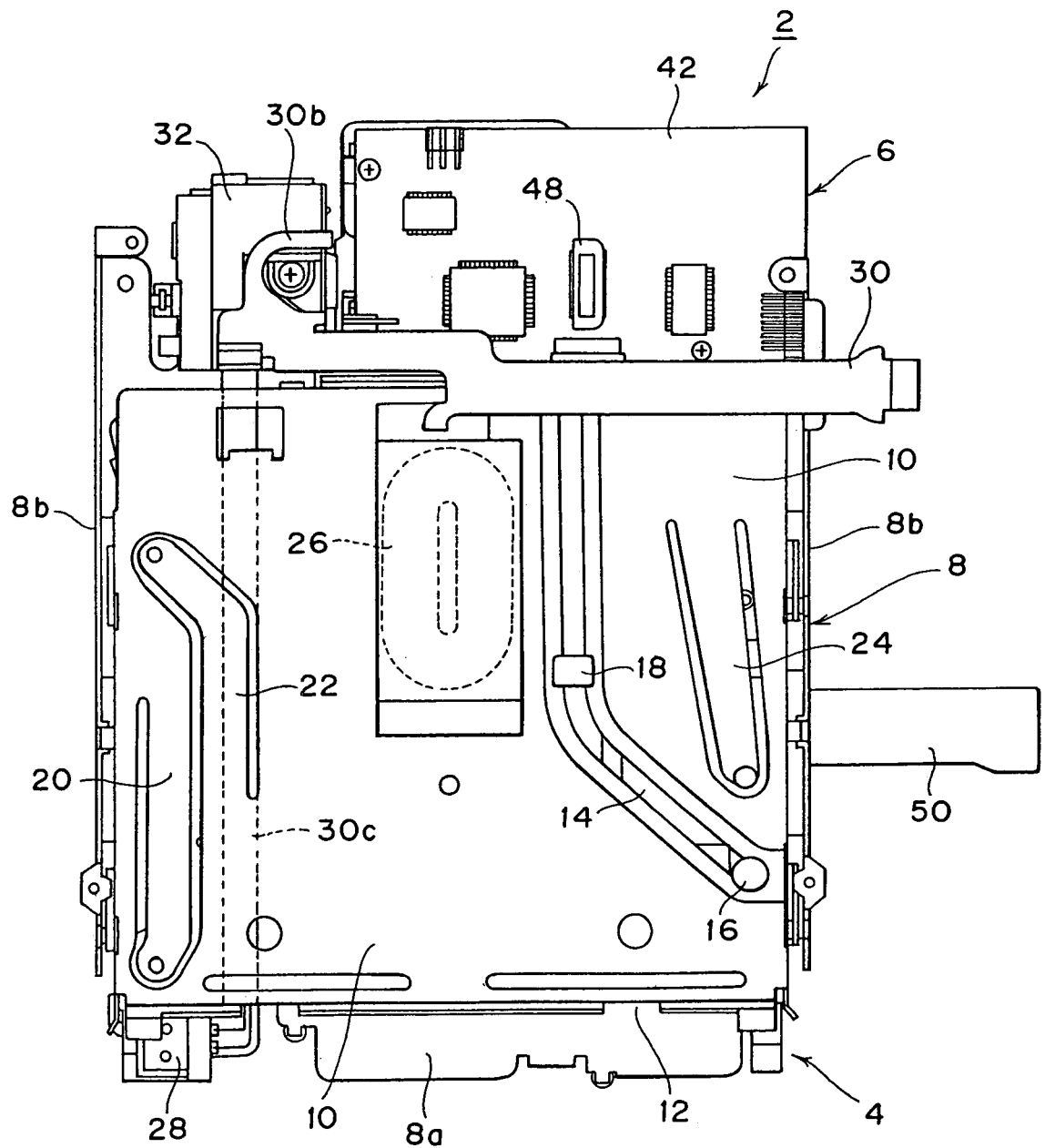
FIG. 2 is a top plan view of the magneto-optical disk drive.

Referring to FIG. 1, there is shown an exploded perspective view of a magneto-optical disk drive 2 according to a preferred embodiment of the present invention. The magneto-optical disk drive 2 is composed generally of a load/eject mechanism unit 4 and a read/write mechanism unit 6. The load/eject mechanism unit 4 includes a chassis 8 having a bottom plate 8a and a pair of side plates 8b, and a cartridge holder 10 mounted on the chassis 8 so as to be vertically movable with respect to the bottom plate 8a of the chassis 8.

An insert opening 12 for allowing insertion of a magneto-optical disk cartridge in the direction shown by an arrow C is defined by the cartridge holder 10 and the bottom plate 8a of the chassis 8. The cartridge holder 10 is formed with a guide groove 14. The guide groove 14 is composed of a first portion obliquely extending from one end of the insert opening 12 laterally inward of the cartridge holder 10 and a second portion extending from an inward end of the first portion to the rear end of the cartridge holder 10 in parallel to the longitudinal direction of the cartridge holder 10. A first slider 16 and a second slider 18 are slidably engaged with the guide groove 14.

A continuous slit 23 is formed at one side portion of the cartridge holder 10 to thereby form a first spring arm 20 and a second spring arm 22 integral with the cartridge holder 10. Similarly, a slit 25 is formed at the other side portion of the cartridge holder 10 to thereby form a third spring arm 24 integral with the cartridge holder 10. A bias magnetic field generating device 26 is mounted on the cartridge holder 10.

A cartridge identification sensor 28 for detecting a write protected condition of the cartridge and the kind of the cartridge is mounted on the bottom plate 8a of the chassis 8. Further, an eject motor 32 for ejecting the magneto-optical disk cartridge inserted in the cartridge holder 10 is mounted on the bottom plate 8a at its rear end portion opposite to the insert opening 12.

Although not shown, a vertically moving mechanism for the cartridge holder 10 is provided between the chassis 8 and the cartridge holder 10. When the magneto-optical disk cartridge is fully inserted into the cartridge holder 10, the cartridge holder 10 is moved toward the bottom plate 8a of the chassis 8 by the vertically moving mechanism, so that the magneto-optical disk cartridge is pressed on the bottom plate 8a. In this condition, a shutter of the magneto-optical disk cartridge is opened, and a magneto-optical disk (to be hereinafter described) exposed is chucked to a spindle motor (to be hereinafter described). Such a vertically moving mechanism for the cartridge holder 10 is known in the art, so any further description thereof will be omitted herein.

The load/eject mechanism 4 is provided with a flexible printed circuit board (FPC) 30. The FPC 30 is branched at its front end portion into three parts, i.e., a first FPC 30a, a second FPC 30b, and a third FPC 30c. The first FPC 30a is connected to the bias magnetic field generating device 26. The second FPC 30b is connected to the eject motor 32. The third FPC 30c is connected to the cartridge identification sensor 28. The read/write mechanism unit 6 includes a base 34 formed of metal. The load/eject mechanism unit 4 is mounted on the base 34. A spindle motor 36 is fixed to the base 34.

A movable optical assembly 38, a fixed optical assembly 40, and a printed circuit board 42 are mounted on the base 34. The movable optical assembly 38 includes a carriage 44 on which an objective lens 46 is mounted. A connector 48 to be connected to a printed circuit board (not shown) mounted on the upper side of the load/write mechanism unit 4 is mounted on the printed circuit board 42. Reference numeral 50 denotes an FPC for transferring a signal to the spindle motor 36 and a signal to the movable optical assembly 38. FIG. 2 is a plan view showing an assembled condition of the magneto-optical disk drive 2 shown in FIG. 1.

Figure 3:
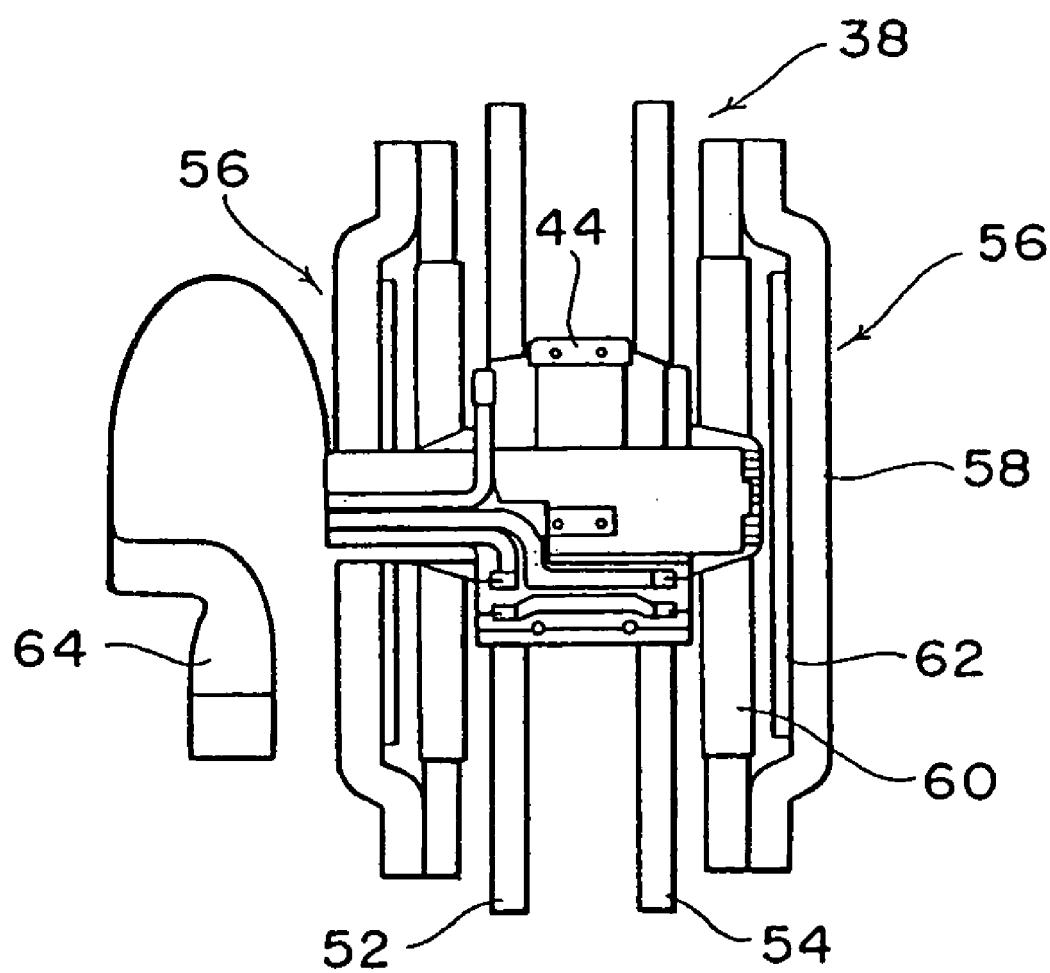
FIG. 3 is a bottom plan view of a movable optical assembly in the magneto-optical disk drive.

As shown in FIG. 3, the movable optical assembly 38 is a preassembly constructed by inserting first and second guide rails 52 and 54 and two center yokes 60 through the carriage 44, and fixing a side yoke 58 to each center yoke 60. A permanent magnet 62 is fixed to each side yoke 58. Thus, two magnetic circuits 56 are formed by the two side yokes 58, the two center yokes 60, and the two permanent magnets 62. A pair of coils (not shown) are mounted on the carriage 44, and these coils are connected to an FPC 64.

These magnetic circuits 56 and coils constitute a voice coil motor (VCM). The VCM is driven by supplying a current through the FPC 64 to the coils, so that the carriage 44 is moved along the first and second guide rails 52 and 54. While the carriage 44 is linearly driven by the VCM in this preferred embodiment, an arm to be rotationally driven may be used in place of the carriage 44, so as to move a light beam across the tracks on an optical storage medium.

Figure 4:
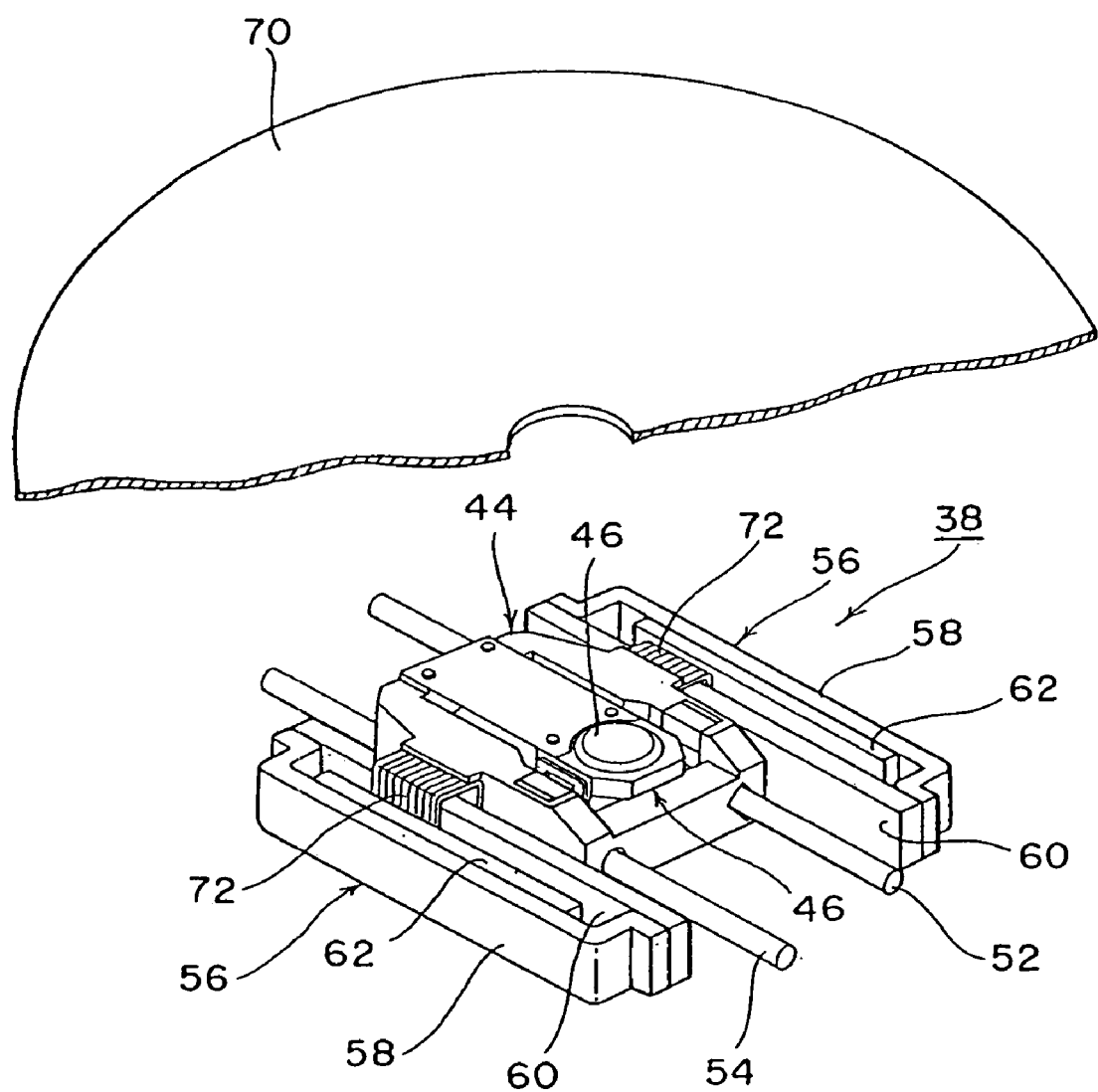
FIG. 4 is a perspective view of the movable optical assembly.

Referring to FIG. 4, there is shown a perspective view of the movable optical assembly 38 in relation to a magneto-optical disk 70. The objective lens 46 is mounted on the carriage 44. A pair of coils 72 are fixed to the opposite sides of the carriage 44. Each coil 72 is inserted in a gap defined between the corresponding center yoke 60 and the corresponding permanent magnet 62.

Figure 5:
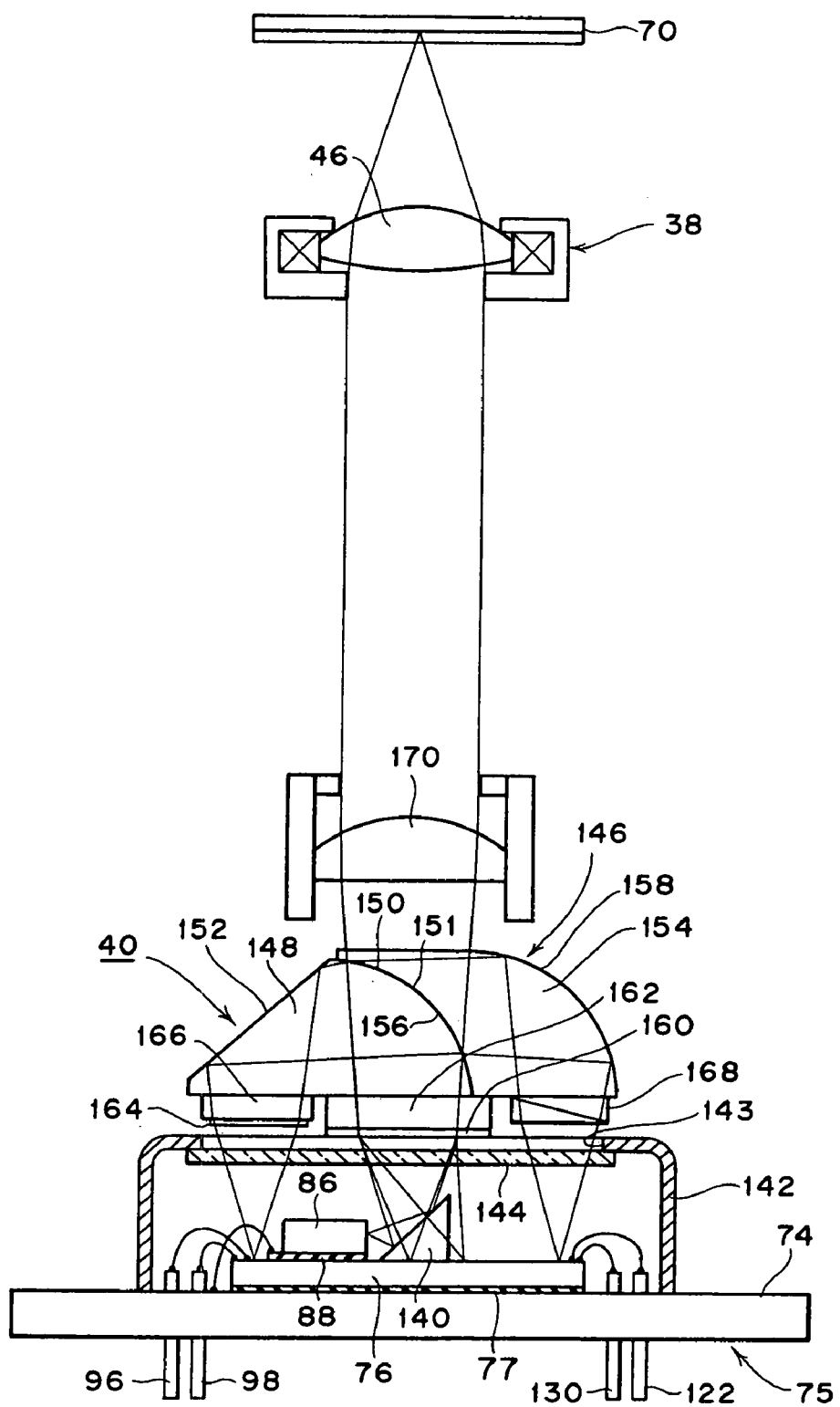
FIG. 5 is a schematic illustration of an optical pickup according to a preferred embodiment of the present invention.

Referring to FIG. 5, there is shown a schematic illustration of an optical pickup according to a preferred embodiment of the present invention. The optical pickup is configured by the movable optical assembly 38 having the objective lens 46 and the fixed optical assembly 40 mounted on the base 34 shown in FIG. 1. The fixed optical assembly 40 includes a stem (optical base) 74 to be mounted on the base 34. The stem 74 is formed by pressing a metal plate such as an iron plate. The upper surface of the stem 74 is plated with gold.

A silicon (Si) substrate 76 is mounted on the stem 74. An $SiO_2$ film 77 is formed on the lower surface of the Si substrate 76 to insulate the Si substrate 76 from the stem 74. The resistivity of the Si substrate 76 is $10^{15}$ Ωcm, and it is a semiconductor substrate. Any other semiconductor substrates such as a germanium (Ge) substrate and a GaAs substrate may be used in place of the Si substrate 76.

The $SiO_2$ film 77 is formed by thermal oxidation of silicon, i.e., by heating the lower surface of a Si wafer. Accordingly, no special insulating member is required, and the $SiO_2$ film 77 can be formed at a low cost. The $SiO_2$ film 77 may be replaced by any other dielectric films having good heat conductivity, such as aluminum nitride (AlN) and silicon carbide (SiC). The Si substrate 76 is bonded to the stem 74 by using Au—Sn solder. To improve the bonding property of the Si substrate 76 to the stem 74, the upper surface of the stem 74 is plated with gold as mentioned above. Similarly, the lower surface of the Si substrate 76 is also plated with gold.

Figure 7:
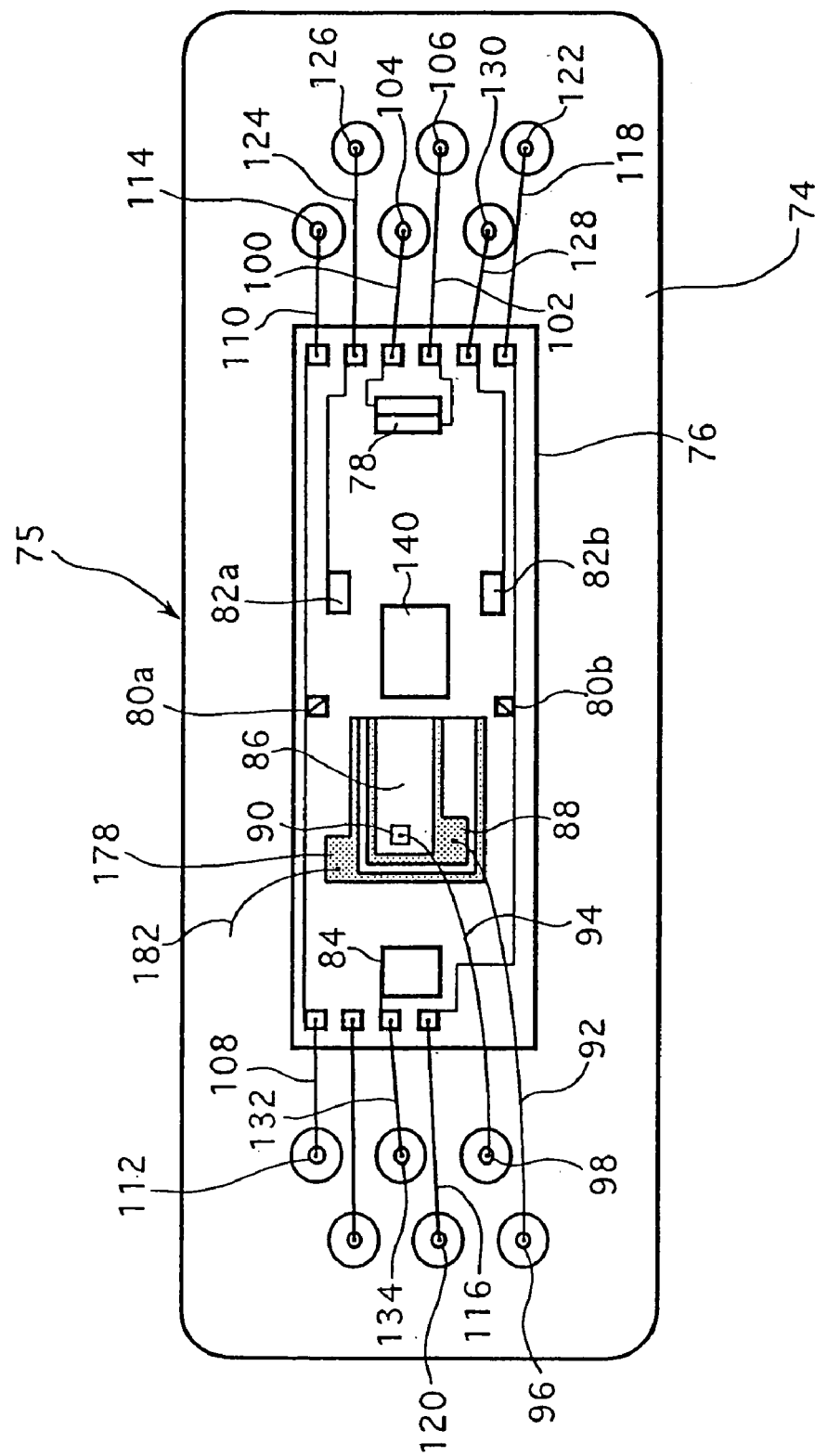
FIG. 7 is a top plan view of the optical unit shown in FIG. 6.

Referring to FIG. 7, there is shown a plan view of an optical unit 75 according to a first preferred embodiment. The optical unit 75 includes the stem 74 and the Si substrate 76 mounted on the stem 74. The Si substrate 76 is integrally formed with a PIN-photodiode 78 for detecting a magneto-optical signal (MO signal), PIN-photodiodes 80a and 80b for detecting a focusing error signal, PIN-photodiodes 82a and 82b for detecting a tracking error signal, and a PIN-photodiode 84 for monitoring the power of a laser diode (LD) chip 86.

Aluminum wiring for leading out the signals from the PIN-photodiodes 78, 80a, 80b, 82a, 82b, and 84 is patterned on the Si substrate 76. The LD chip 86 is mounted on the Si substrate 76. The LD chip 86 has a central oscillation wavelength of 685 nm and a beam spread angle of about 20°. The LD chip 86 is a chip cut from a wafer. Reference numeral 88 denotes an electrode formed on the lower surface of the LD chip 86. The electrode 88 is connected to a terminal 96 by a wire 92. An electrode 90 formed on the upper surface of the LD chip 86 is connected to a terminal 98 by a wire 94.

The PIN-photodiode 78 for detection of a MO signal is connected to terminals 104 and 106 respectively by wires 100 and 102. The PIN-photodiode 80a for detection of a focusing error signal is connected to terminals 112 and 114 respectively by wires 108 and 110. Similarly, the PIN-photodiode 80b for detection of a focusing error signal is connected to terminals 120 and 122 respectively by wires 116 and 118. The PIN-photodiode 82a for detection of a tracking error signal is connected to a terminal 126 by a wire 124. Similarly, the PIN-photodiode 82b for detection of a tracking error signal is connected to a terminal 130 by a wire 128. The PIN-photodiode 84 for detection of monitor light is connected to a terminal 134 by a wire 132. These terminals 96, 98, 104, 106, 112, 114, 120, 122, 126, 130, and 134 are hermetically sealed with glass and thereby insulated from the stem 74.

Referring again to FIG. 5, a laser beam is output from the LD chip 86 in the horizontal direction, and a reflection prism 140 for reflecting the laser beam in the vertical direction is therefore mounted on the Si substrate 76. The reflection prism 140 is formed of BK7 glass (manufactured by Shott Inc.), and has a reflection surface coated with a phaseless reflecting film. The reflection prism 140 is fabricated by glass molding, polishing, etc.

A cap 142 formed of Kovar is welded to the stem 74. The Si substrate 76 and the LD chip 86 are accommodated in the cap 142. The cap 142 has an opening 143 for forming a reciprocative optical path of a light beam. The opening 143 is closed by a glass plate 144. Accordingly, the inside of the cap 142 is enclosed. A hologram 160 formed on the lower surface of a glass substrate 162 is bonded by adhesive to the upper surface of the cap 142. Mass production of the hologram 160 can be made by forming a plurality of hologram patterns on a single glass substrate by etching and separating these hologram patterns by dicing to obtain individual holograms.

The hologram 160 has a patterned diffraction grating for dividing a focusing error signal and a tracking error signal. A reflected beam from the magneto-optical disk 70 is diffracted by the diffraction grating of the hologram 160, and then divisionally focused on the PIN-photodiodes 80a and 80b for detection of a focusing error signal and on the PIN-photodiodes 82a and 82b for detection of a tracking error signal, formed on the Si substrate 76.

A beam splitter unit 146 is fixedly mounted on the glass substrate 162 opposite to the hologram 160 by optical adhesive. The beam splitter unit 146 includes a glass block 148 having a cylindrical surface 150 and an inclined surface 152, and a glass block 154 bonded by adhesive to the glass block 148. A polarizing light spitting film 151 is formed on the cylindrical surface 151 of the glass block 148. The glass block 154 has a concave cylindrical surface 156 just fitted with the cylindrical surface 150, and a cylindrical reflection surface 158. The concave cylindrical surface 156 of the glass block 154 is bonded by optical adhesive to the cylindrical surface 150 of the glass block 148.

Preferably, the inclined surface 152 of the glass block 148 and the cylindrical reflection surface 158 of the glass block 154 are coated with a reflecting film. A glass plate 166 formed with a focusing hologram lens 164 is bonded by adhesive to the lower surface of the glass block 148. Further, a Wollaston prism 168 for splitting the reflected beam into a P-polarized light component and an S-polarized light component is bonded by adhesive to the lower surface of the glass block 154.

The LD chip 86 is bonded by Pb—Sn solder to the Si substrate 76. The temperature of soldering of the LD chip 86 to the Si substrate 76 must be lower than the temperature of soldering of the Si substrate 76 to the stem 74. Accordingly, Au—Sn solder is used to bond the Si substrate 76 to the stem 74 and heated to about 320° C. On the other hand, Pb—Sn solder is used to bond the LD chip 86 to the Si substrate 76 and heated to about 240° C. Reference numeral 170 denotes a collimator lens formed from a normal glass lens. The collimator lens 170 has a focal length of 10 mm, and it is an aspherical lens in which the focal length is corrected by an amount corresponding to the total thickness of the beam splitter unit 146 and the hologram substrate 162.

Figure 8:
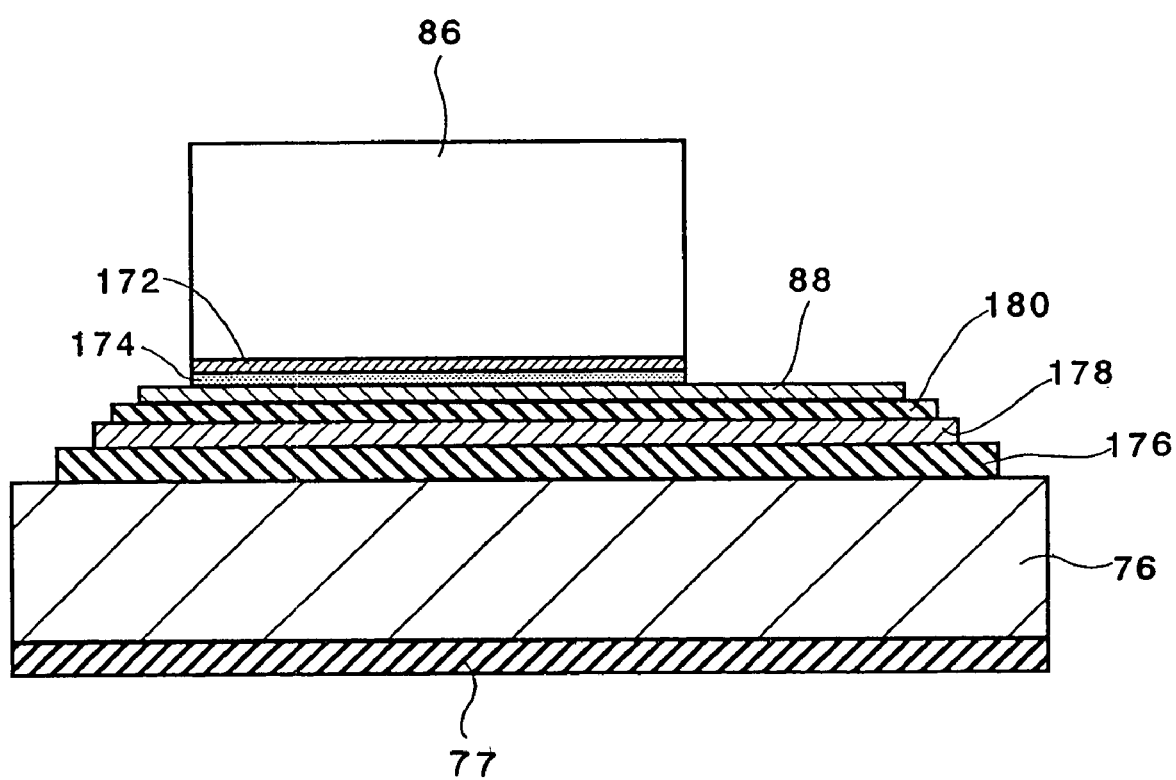
FIG. 8 is an enlarged sectional view of an LD chip mounting portion in the optical unit.

Referring to FIG. 8, there is shown an enlarged sectional view of an LD chip mounting portion. An $SiO_2$ film 176 is formed on the upper surface of the Si substrate 76, and a conductor film 178 of a gold plating film is formed on the $SiO_2$ film 176. An $SiO_2$ film 180 is formed on the conductor film 178, and the LD electrode 88 of a gold plating film is formed on the $SiO_2$ film 180. The $SiO_2$ films 176 and 180 are formed by sputtering, CVD, or electron beam process.

However, the $SiO_2$ film 180 is formed selectively on a part of the conductor film 178 to be required for bonding to the LD chip 86 rather than the entire surface of the conductor film 178, in consideration of wire connection to the outside of the LD chip 86. A gold plating film 172 is formed on the lower surface of the LD chip 86. The gold plating film 172 and the LD electrode 88 are bonded together by Pb—Sn solder 174. Referring again to FIG. 7, the conductor film 178 is connected to the stem 74 by a wire 182. Accordingly, the conductor film 178 is at the same electric potential as that of the stem 74. Since the stem 74 is mounted on the base 34 of the magneto-optical disk drive, the conductor film 178 is at a ground potential.

In operation, a P-polarized laser beam output from the LD chip 86 is reflected by the reflection prism 140 to change its optical path from the horizontal direction to the vertical direction. The laser beam reflected by the reflection prism 140 is passed through the hologram 160 and then passed through the polarizing light splitting film 151 with a transmittance of about 70%. The laser beam reflected by the polarizing light splitting film 151 is reflected by the inclined surface 152 and then focused onto the PIN-photodiode 84 for detection of monitor light by the focusing hologram lens 164. Then, the power of the LD chip 86 is controlled to a predetermined level according to an output signal from the PIN-photodiode 84.

The laser beam passed through the polarizing light splitting film 151 is converted into a collimated beam by the collimator lens 170, and the collimated beam is focused onto the magneto-optical disk 70 by the objective lens 46. A reflected beam from the surface of the magneto-optical disk 70 undergoes Kerr rotation according to information written on the magneto-optical disk 70 to thereby include an S-polarized light component. The reflected beam is reconverted into a collimated beam by the objective lens 46 and then converged by the collimator lens 170 to enter the beam splitter unit 146.

The P-polarized light component in the reflected beam is passed through the polarizing light splitting film 151 with a transmittance of about 70%, and about 30% of the P-polarized light component is reflected by the polarizing light splitting film 151. On the other hand, the S-polarized light component in the reflected beam is reflected by the polarizing light splitting film 151 with a reflectance of about 97%. Although the proportion of the S-polarized light component in the reflected beam is very small, the proportion of the S-polarized light component can be increased by reflecting most of the S-polarized light component on the polarizing light splitting film 151.

The beam reflected by the polarizing light splitting film 151 is totally reflected downward by the cylindrical reflection surface 158 of the glass block 154 to enter the Wollaston prism 168. The beam is then split into a P-polarized light component and an S-polarized light component by the Wollaston prism 168, and these components are detected by the PIN-photodiode 78. The PIN-photodiode 78 includes a photodiode for detecting a P-polarized light component and a photodiode for detecting an S-polarized light component. Signals detected by these two photodiodes are subjected to differential detection by a method well known in the art to thereby detect a magneto-optical signal. On the other hand, the reflected beam transmitted by the polarizing light splitting film 151 enters the hologram 160 to undergo diffraction. The diffracted beams from the hologram 160 enter the PIN-photodiodes 80a and 80b for detection of a focusing error signal and the PIN-photodiodes 82a and 82b for detection of a tracking error signal.

The hologram 160 may be fabricated by direct drawing using an electron beam or a laser beam. While it is necessary to tilt a hologram pattern to expect high efficiency in the direct drawing, such a requirement can be met by multiple drawing. Another fabrication method for a hologram includes the steps of preliminarily directly drawing a large hologram pattern, reducing the hologram pattern by using a stepper to prepare a mask, and transferring the hologram pattern by a photolithography. In this case, the hologram pattern is fabricated by ion beam etching using a photoresist or the like as a mask.

According to the optical pickup of the above preferred embodiment, fluctuations in oscillation wavelength due to temperature changes as the emission characteristic of the LD chip 86 can be reduced to reduce the influence of chromatic aberration of an optical system. Further, since the Si substrate 76 is insulated from the stem 74 by the SiO$_2$ film 77, a deterioration in radiation characteristic can be reduced. Further, the conductor film 178 is provided between the LD chip 86 and the Si substrate 76, and the conductor film 178 is set at the same electric potential as a ground potential. Accordingly, it is possible to avoid the crosstalk between a drive signal to the LD chip 86 in writing data and output signals from the PIN-photodiodes 80a and 80b for detection of a focusing error signal, the PIN-photodiodes 82a and 82b for detection of a tracking error signal, and the PIN-photodiode 84 for detection of monitor light.

Further, since the potential of the conductor film 178 present under the LD chip 86 is set to a ground potential, the emission characteristic of the LD chip 86 can be improved. Further, since the electrodes 88 and 90 of the LD chip 86 are connected directly to the terminals 96 and 98 provided on the stem 74 by the wires 92 and 94, respectively, possible runaround of a signal to each PIN-photodiode can be avoided.

Figure 6:
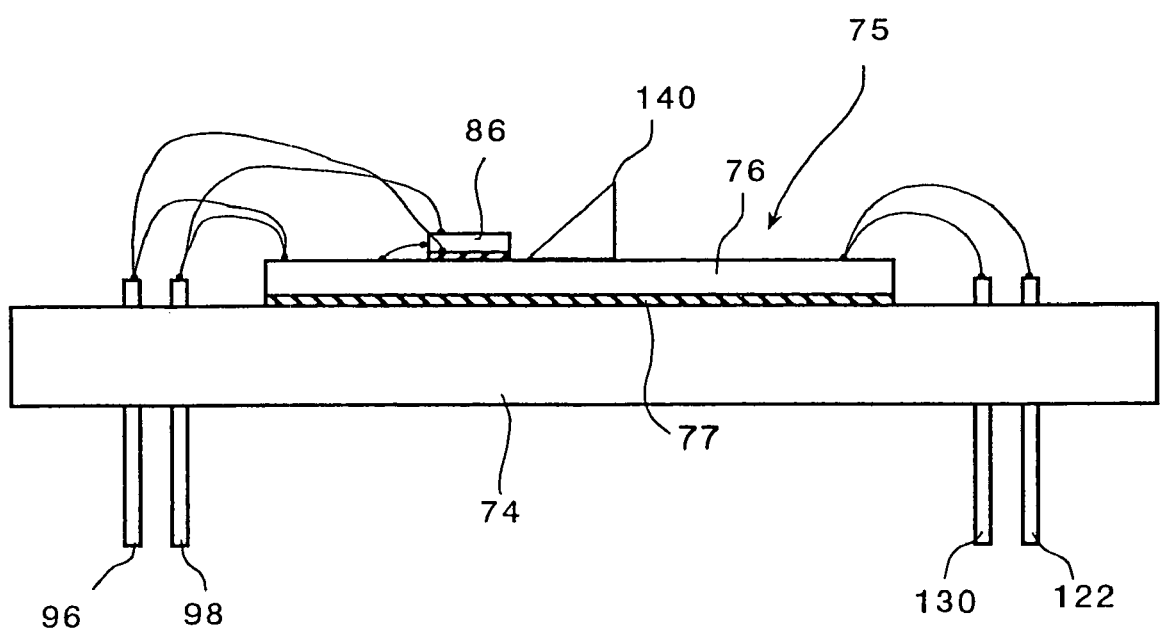
FIG. 6 is an elevational view of an optical unit according to a first preferred embodiment.
Figure 9:
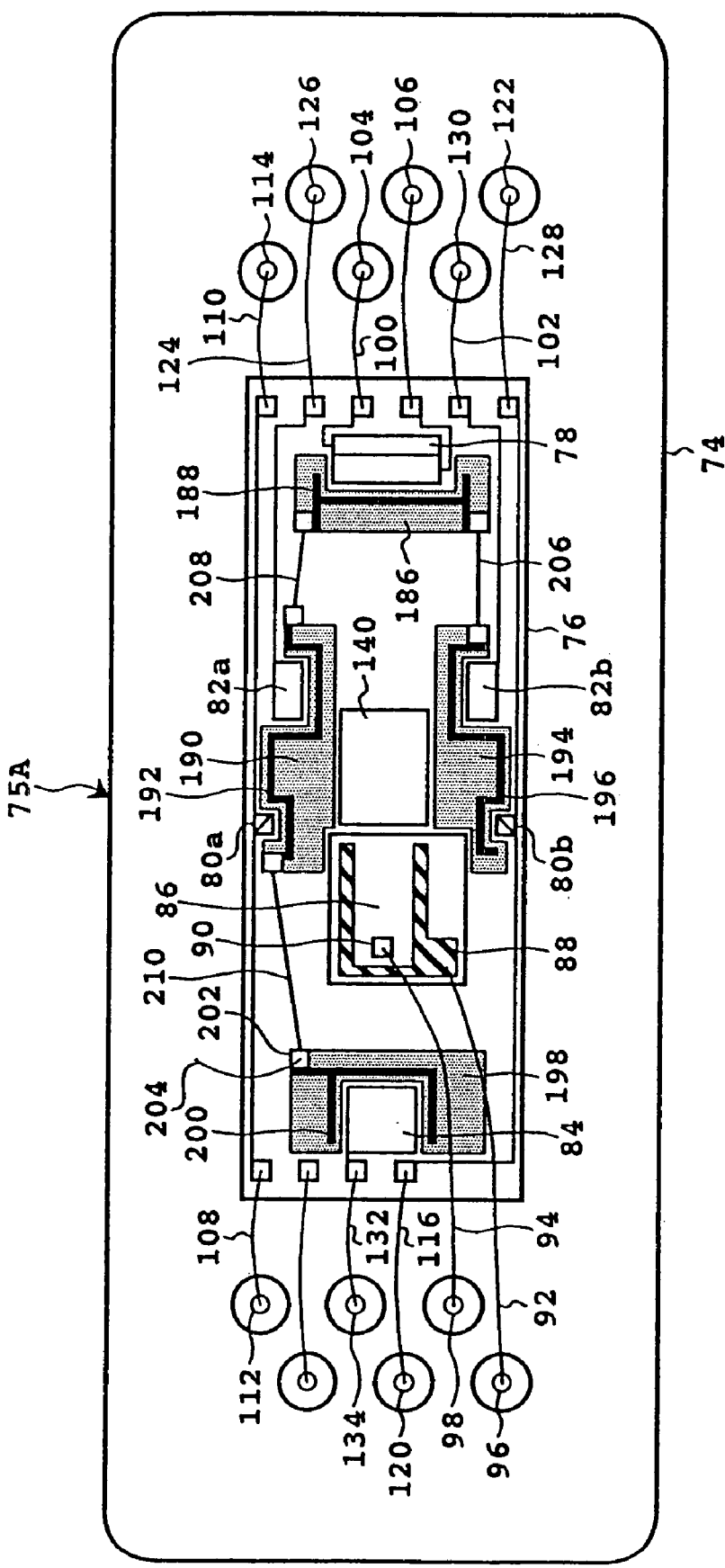
FIG. 9 is a top plan view of an optical unit according to a second preferred embodiment.

Referring to FIG. 9, there is shown a plan view of an optical unit 75A according to a second preferred embodiment of the present invention. In the following description of the second preferred embodiment and subsequent preferred embodiments, substantially the same parts as those of the optical unit 75 according to the first preferred embodiment shown in FIGS. 6 and 7 will be denoted by the same reference numerals, and the description thereof will be omitted to avoid repetition.

A dummy photodetecting region 186 is formed adjacent to the PIN-photodiode 78 for detection of a MO signal on the Si substrate 76. A dummy photodetecting region 190 is formed adjacent to the PIN-photodiodes 80a and 82a on the Si substrate 76. A dummy photodetecting region 194 is formed adjacent to the PIN-photodiodes 80b and 82b on the Si substrate 76. Further, a dummy photodetecting region 198 is formed adjacent to the PIN-photodiode 84 for detection of monitor light on the Si substrate 76. These dummy photodetecting regions 186, 190, 194, and 198 function as PIN-photodiodes.

The dummy photodetecting region 186 is formed with a dummy electrode 188 surrounding the PIN-photodiode 78. The dummy photodetecting region 190 is formed with a dummy electrode 192 surrounding the PIN-photodiodes 80a and 82a. The dummy photodetecting region 194 is formed with a dummy electrode 196 surrounding the PIN-photodiodes 80b and 82b. The dummy photodetecting region 198 is formed with a dummy electrode 200 surrounding the PIN-photodiode 84.

The dummy electrode 200 is electrically connected to a terminal 202, and the terminal 202 is electrically connected to the stem 74. The dummy photodetecting regions 194 and 196 are electrically connected by aluminum wiring 206. The dummy photodetecting regions 186 and 190 are electrically connected by aluminum wiring 208. The dummy photodetecting regions 190 and 198 are electrically connected by aluminum wiring 210. Accordingly, all of the dummy photodetecting regions 194, 186, 190, and 198 are electrically connected to the stem 74 by the wire 204 to establish the same electric potential as a ground potential.

The dummy electrodes 188, 192, 196, and 200 are located on the dummy photodetecting regions 186, 190, 194, and 198 so as to surround the PIN-photodiodes 78, 80a and 82a, 80b and 82b, and 84, respectively. Accordingly, electrical charge generated in each dummy photodetecting region does not leak into the electrode of the adjacent PIN-photodiode, but flows into the corresponding dummy electrode. Since each dummy electrode is electrically connected to the stem 74 having a ground potential, there is no adverse effect on the signal detected by each PIN-photodiode.

Figure 10:
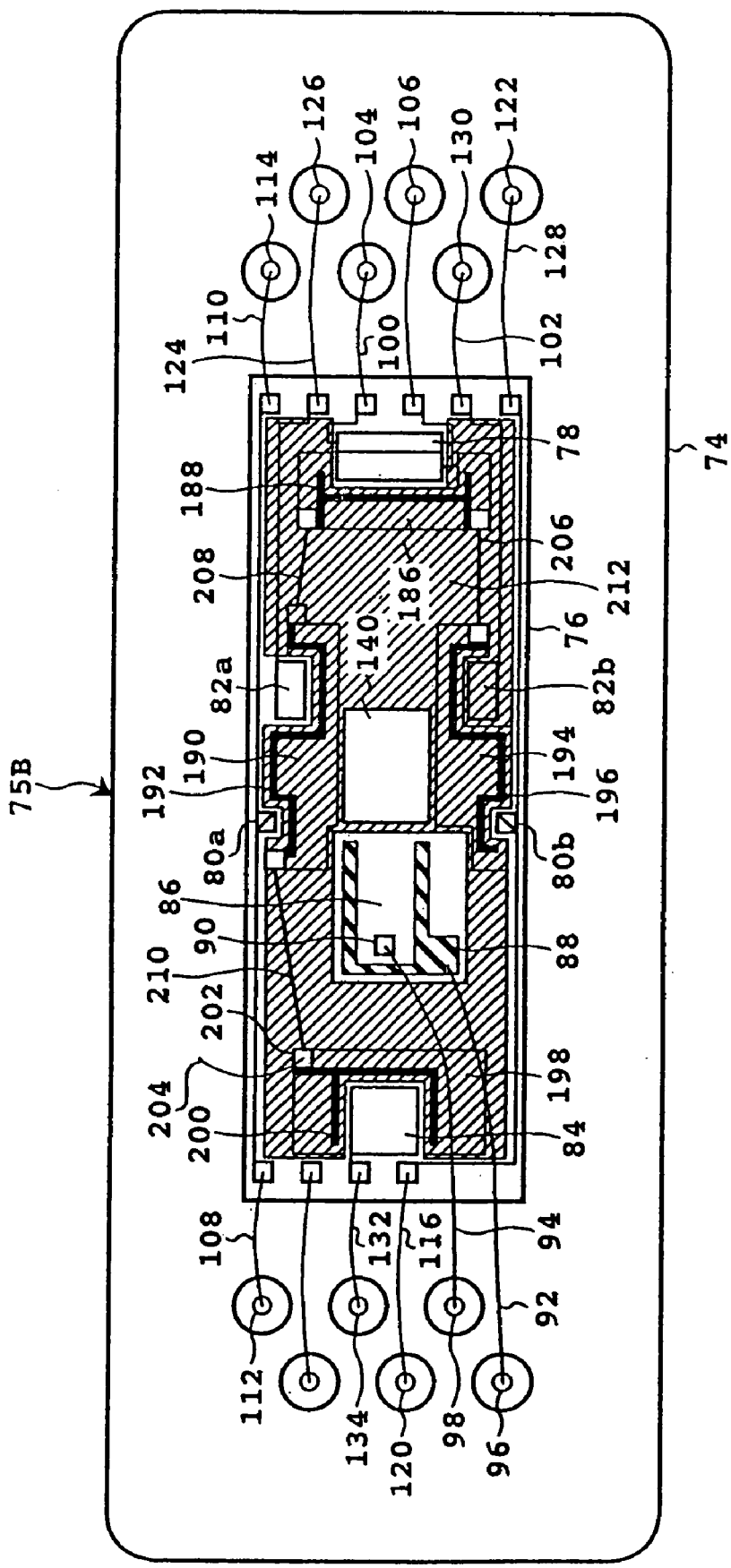
FIG. 10 is a top plan view of an optical unit according to a third preferred embodiment.
Figure 11:
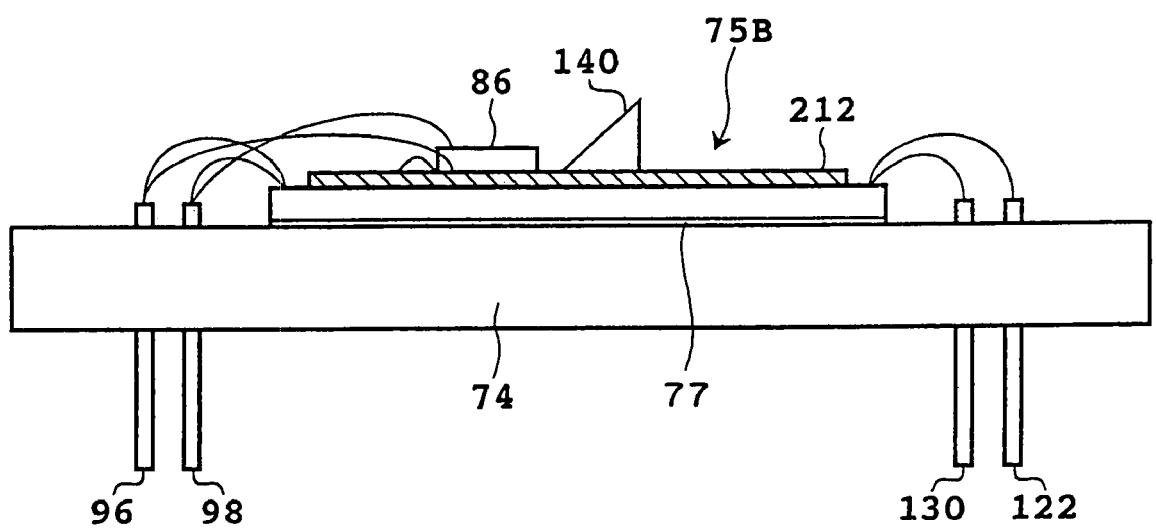
FIG. 11 is an elevational view of the optical unit shown in FIG. 10.

In the case that the intensity of stray light in recording or erasing information, or in the case that an optical modulation rate is high, there is a possibility that the electrical charge in each dummy photodetecting region may be reduced in responsiveness to leak into an MO signal and a servo signal, for example. To prevent this possibility and further improve the quality of a signal current, there is provided an optical unit 75B according to a third preferred embodiment of the present invention as shown in FIGS. 10 and 11. More specifically, the optical unit 75B includes a light shielding film 212 having light absorptivity formed on the Si substrate 76 except the mounting portions for the LD chip 86, the reflection prism 140, and the PIN-photodiodes 78, 80a, 80b, 82a, 82b, and 84 and also except the pad portions for connection of the aluminum wiring.

Preferably, the light shielding film 212 is formed from a polyimide film. The thickness of the polyimide film is about 1 to 5 μm, preferably about 2 to 3 μm. By adopting a polyimide film as the light shielding film 212, it can be easily patterned by applying a resist on the substrate and next performing exposure and development in the photodiode fabrication step. Alternatively, the light shielding film 212 may be formed of a resist material or the like. Further, the light shielding film 212 hardly contains gas discharging components, so that there is almost no possibility of contamination of the PIN-photodiodes 78, 80a, 80b, 82a, 82b, and 84 in hermetically sealing the cap 142. Further, a current generating stray light can be suppressed to thereby suppress fluctuations in supply voltage and contribute to a reduction in power consumption.

While the light shielding film 212 is formed on the Si substrate 76 except the above-mentioned portions in the preferred embodiment shown in FIG. 10, the light shielding film in the present invention may be formed so as to cover at least the dummy photodetecting regions 186, 190, 194, and 198. The stray light is caused by the incidence of surface reflection light from the hologram 160 and the beam splitter unit 146 into the optical unit 75B. However, since the light shielding film 212 having light absorptivity is present in the optical unit 75B, a photocurrent is not induced by the stray light except from the PIN-photodiodes 78, 80a, 80b, 82a, 82b, and 84. Further, there is no possibility that the stray light may be reflected on the light shielding film 212 to become a new stray light component. As a result, undue noise components are not mixed into a magneto-optical signal current or a servo signal current, thereby obtaining a high-quality output signal.

Figure 12:
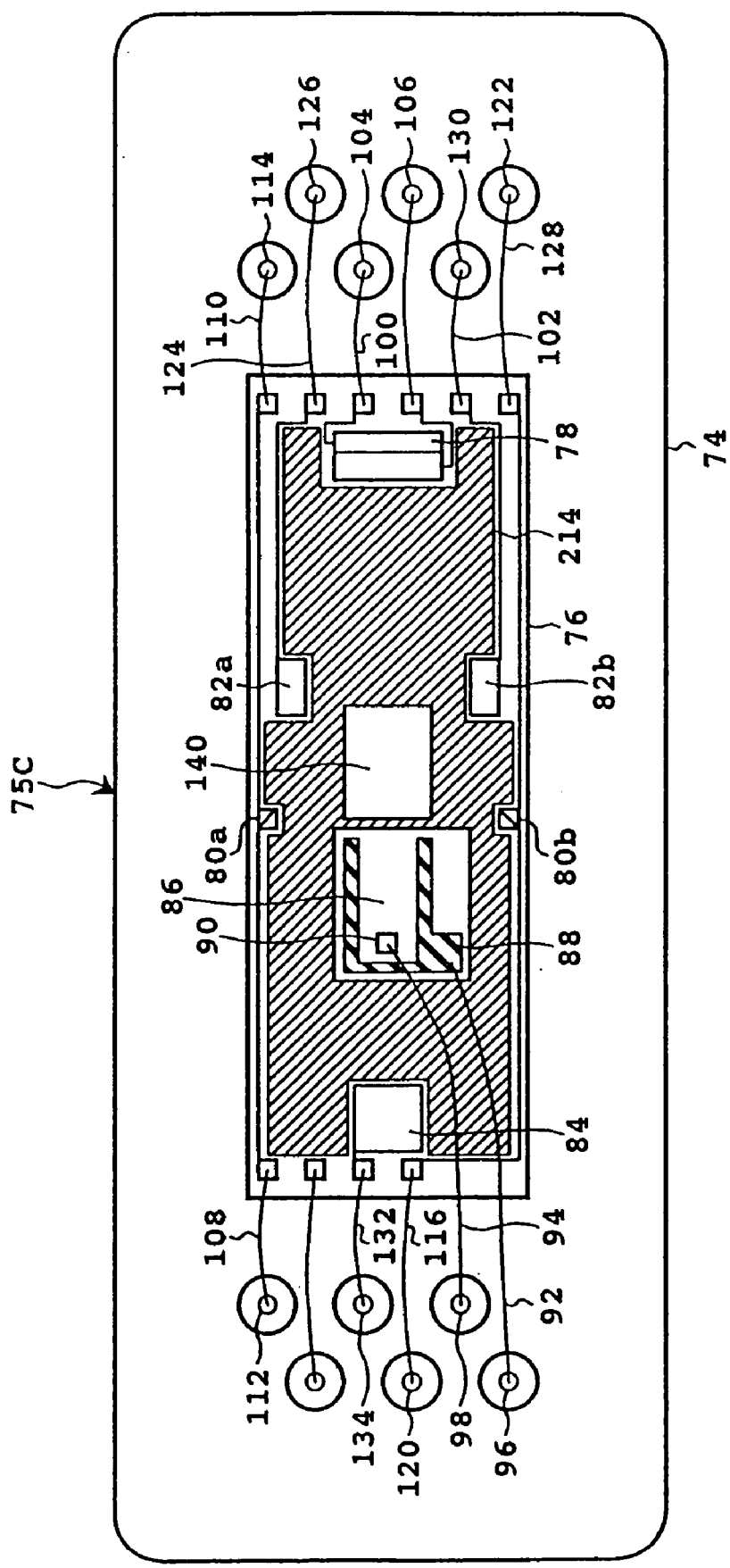
FIG. 12 is a top plan view of an optical unit according to a fourth preferred embodiment.

Referring to FIG. 12, there is shown a plan view of an optical unit 75C according to a fourth preferred embodiment of the present invention. In the optical unit 75C shown in FIG. 12, the dummy photodetecting regions 186, 190, 194, and 198 shown in FIGS. 9 and 10 are not provided, but a metal film 214 having a surface modified so as to have light absorptivity is formed on the Si substrate 76. The thickness of the metal film 214 is set to 2 to 8 μm, preferably 4 to 6 μm so as not to transmit light. Preferably, the metal film 214 is formed of the same material as that of the wiring patterned on the Si substrate 76. In this case, the metal film 214 can be formed in the same process as the wiring forming process, thus improving the workability. Usually, the wiring pattern is formed of aluminum, so that the metal film 214 is preferably formed of aluminum.

In the case that the metal film 214 is formed of aluminum, the surface of the aluminum film is preferably modified to prevent the reflection of stray light and to have light absorptivity, thereby avoiding reflected scattering light. More specifically, the surface modification is performed by masking the surface of the Si substrate 76 so that only a light shielding region (Al film) is exposed, and next anodizing the surface of the light shielding aluminum film to form a black coating, thereby obtaining a light absorbing surface. The aluminum film thus having an anodized surface is a light shielding film improved in heat resistance and reliability, so that the stray light component entering the Si substrate 76 can be almost cut off and the reflected light from the surface of the metal film 214 can also be suppressed. As a result, it is also possible to suppress the generation of a new stray light component due to re-reflection of reflected scattering light from the surface of the metal film 214 inside the optical unit 75C. The material of the metal film 214 is not limited to aluminum, but any other materials having light absorptivity may be used.

While the metal film 214 is formed on the almost entire surface of the Si substrate 76 in the preferred embodiment shown in FIG. 12, the metal film 214 may be formed on only regions adjacent to the PIN-photodiodes 78, 80a, 80b, 82a, 82b, and 84.

Having thus described the optical pickup of the present invention in relation to a magneto-optical disk drive, the application of the present invention is not limited to the magneto-optical disk drive. For example, the optical pickup of the present invention is applicable also to any other types of optical storage devices using an optical pickup for driving an optical storage medium such as CD, DVD, and optical card. Further, the optical pickup of the present invention is applicable also to a microscope unit and various inspection devices, for example.

According to the present invention as described above, the substrate integrally formed with a plurality of photodiodes is mounted on the stem with an insulating film being formed on the lower surface (mount surface) of the substrate, so that the radiation characteristic of the LD chip mounted on the upper surface of the substrate can be improved to thereby obtain a stable emission characteristic. Further, a conductor film is provided under the lower surface of the LD chip, and the electric potential of the conductor film is set to a ground potential, thereby reducing the crosstalk between a drive signal to the LD chip and output signals from the photodiodes to obtain a good servo signal and regenerative signal. Accordingly, the radiation from the LD chip can be facilitated to allow a stable writing operation, and an LD chip drive signal component mixing into a servo signal can be suppressed to thereby improve the quality of the servo signal and allow stable control. Thusly, it is possible to provide an optical pickup which can ensure high reliability and low cost.

According to the preferred embodiment employing a dummy photodetecting region formed adjacent to each photodiode, a photocurrent induced by stray light incident on the dummy photodetecting region can be guarded by a dummy electrode formed in the dummy photodetecting region, thereby avoiding adverse effects on a regenerative signal detector and/or a servo signal detector to obtain a good regenerative signal and servo signal. According to the preferred embodiment employing a light shielding film or metal film having light absorptivity so formed as to cover the upper surface of the substrate, a stray light component reflecting on the surface of the film can be suppressed to prevent the generation of new stray light. Accordingly, the regenerative signal and the servo signal can be improved in quality to thereby provide an optical pickup having high reliability.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An optical pickup comprising:
   a stem;
   a substrate mounted on said stem;
   a laser diode mounted on, and electrically insulated from, said substrate; and
   a photodetector provided on said substrate for detecting return light from an object to be irradiated;
   said substrate being biased at a given voltage and having an insulating member opposed to said stem; and
   said laser diode having a first electrode opposed to said substrate with a first insulating film, a conductor film, and a second insulating film being interposed between said first electrode and said substrate.

2. An optical pickup according to claim 1, wherein said substrate comprises an Si substrate, and each of said insulating member, said first insulating film, and said second insulating film comprises an $SiO_2$ film.

3. An optical pickup according to claim 1, wherein said conductor film and said stem are connected by a first wire.

4. An optical pickup according to claim 3, wherein said laser diode further has a second electrode, said first and second electrodes being connected to said stem by second and third wires, respectively.

5. an optical storage device capable of at least reading information stored in an optical storage medium, comprising:
   a base;
   a carriage movable along said optical storage medium;
   a stem mounted on said base;
   a substrate mounted on said stem;
   a laser diode mounted on, and electrically insulated from, said substrate;
   an objective lens mounted on said carriage for focusing a laser beam from said laser diode onto said optical storage medium; and
   a photodetector provided on said substrate for detecting at least a regenerative signal from a reflected beam from said optical storage medium;
   said substrate being biased at a given potential and having an insulating member opposed to said stem; and
   said laser diode having a first electrode opposed to said substrate with a first insulating film, a conductor film, and a second insulating film being interposed between said first electrode and said substrate.

6. An optical storage device according to claim 5, wherein said substrate comprises an Si substrate, and each of said insulating member, said first insulating film, and said second insulating film comprises an $SiO_2$ film.

7. An optical storage device according to claim 5, wherein said conductor film and said stem are connected by a first wire.

8. An optical storage device according to claim 7, wherein said laser diode further has a second electrode, said first and second electrodes being connected to said stem by second and third wires, respectively.

* * * * *